(12) United States Patent
Stirton

(10) Patent No.: US 6,660,542 B1
(45) Date of Patent: *Dec. 9, 2003

(54) METHOD OF CONTROLLING STEPPER PROCESS PARAMETERS BASED UPON OPTICAL PROPERTIES OF INCOMING PROCESS LAYERS, AND SYSTEM FOR ACCOMPLISHING SAME

(75) Inventor: James Broc Stirton, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 209 days.

This patent is subject to a terminal disclaimer.

(21) Appl. No.: 09/827,453

(22) Filed: Apr. 6, 2001

(51) Int. Cl.[7] .............................. G01R 31/26
(52) U.S. Cl. ...................................... 438/16
(58) Field of Search ............ 438/14, 16, 942, 438/947; 356/603, 604, 620; 430/30

(56) References Cited

U.S. PATENT DOCUMENTS

| | | | |
|---|---|---|---|
| 5,867,276 A | 2/1999 | McNeil et al. | 356/445 |
| 5,877,860 A | 3/1999 | Borden | 356/376 |
| 5,880,838 A | 3/1999 | Marx et al. | 356/351 |
| 6,051,348 A | 4/2000 | Marinaro et al. | 430/30 |
| 6,081,334 A | 6/2000 | Grimbergen et al. | 356/357 |
| 6,245,584 B1 | 6/2001 | Marinaro et al. | 438/14 |
| 6,319,884 B2 * | 11/2001 | Leduc et al. | 510/175 |
| 6,433,878 B1 * | 8/2002 | Niu et al. | 356/603 |
| 6,476,920 B1 * | 11/2002 | Scheiner et al. | 356/630 |
| 6,479,200 B1 * | 11/2002 | Stirton | 430/30 |
| 6,493,496 B2 * | 12/2002 | Nagata | 385/129 |

* cited by examiner

Primary Examiner—W. David Coleman
Assistant Examiner—Brook Kebede
(74) Attorney, Agent, or Firm—Williams, Morgan & Amerson, P.C.

(57) ABSTRACT

The present invention is directed to a method of controlling stepper process parameters based upon optical properties of incoming process layers, and a system for accomplishing same. In one embodiment, the method comprises forming a film stack comprised of at least one process layer and a layer of photoresist, illuminating the film stack, and measuring light reflected off the film stack to generate an optical characteristic trace for the film stack. The method further comprises comparing the generated optical characteristic trace to a target optical characteristic trace, and modifying, based upon a deviation between the generated optical characteristic trace and the target optical characteristic trace, at least one parameter of an exposure process to be performed on the film stack. In another embodiment, the generated optical characteristic trace is compared to a library of calculated optical characteristic traces, and modifying, based upon a deviation between the generated optical characteristic trace and the calculated optical characteristic trace, at least one parameter of an exposure process to be performed on the film stack.

28 Claims, 3 Drawing Sheets

METHOD OF CONTROLLING STEPPER PROCESS PARAMETERS BASED UPON OPTICAL PROPERTIES OF INCOMING PROCESS LAYERS, AND SYSTEM FOR ACCOMPLISHING SAME

BACKGROUND OF THE INVENTION

1. Field of the Invention

This invention relates generally to semiconductor fabrication technology, and, more particularly, to a method of controlling stepper process parameters based upon optical properties of incoming process layers, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.2 $\mu$m (2000 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

Photolithography is a process typically employed in semiconductor manufacturing. Photolithography generally involves forming a patterned layer of photoresist above one or more layers of material that are desired to be patterned and using the patterned photoresist layer as a mask in subsequent etching processes. In general, in photolithography operations, the pattern desired to be formed in the underlying layer or layers of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

In general, the stepper exposure process is performed on a stack comprised of one or more process layers or films and a layer of photoresist. For example, such a stack may be comprised of a layer of polysilicon (formed above a substrate), an anti-reflective coating (ARC) layer, and a layer of photoresist. Alternatively, the ARC layer may be omitted and the stack may be comprised of a layer of polysilicon and a layer of photoresist material. Of course, there are a vast variety of combinations of process layers and materials that may be used to form such film stacks.

Optical characteristics of the stack of process layers to be subjected to the exposure process is very important if the exposure process is to result in a patterned layer of photoresist having the desired DICD dimensions. For example, optical characteristics such as the index of refraction ("n") and the dielectric constant ("k") of the combined stack of materials at a particular exposure wavelength, e.g., 248 nm, may impact the ability of the stepper process to produce features in the layer of photoresist of the desired size. More particularly, variations in these optical characteristics can cause control problems in modern manufacturing operations with its inherently low tolerance for process variations due to the very small absolute size of the features to be formed. For example, the thickness of the various layers comprising the film stack to be patterned may adversely impact the optical characteristics of not only the particular process layer, but also the optical properties of the complete stack. Variations in the base materials of one or more of the films that comprise the film stack may also lead to variations in the optical characteristics of the film stack. For example, when a batch of photoresist material is replaced, it may not have the same optical characteristics as that of the previous batch of photoresist material.

All of the variations may tend to cause the DICD of features formed in the patterned layer of photoresist to be less or greater than desired. In turn, this may lead to excessive rework of the patterned layer of photoresist, i.e., the incorrectly formed layer of photoresist may have to be removed, and the process may have to be repeated. Even worse, if undetected, the variations in the patterned layer of photoresist resulting from the variations in the optical properties of the film stack, may ultimately lead to the formation of features, e.g., gate electrodes, having dimensions that are not acceptable for the particular integrated circuit device under construction. For example, transistors may be produced with gate electrodes that are too wide (relative to a pre-established target value), thereby producing transistor devices that operate at less than desirable switching speeds. All of these problems result in delays, waste, excessive costs and cause reduced yields of the manufacturing operations.

The present invention is directed to a method and system that may solve, or at least reduce, some or all of the aforementioned problems.

SUMMARY OF THE INVENTION

The present invention is generally directed to a method of controlling stepper process parameters based upon optical properties of incoming process layers, and a system for accomplishing same. In one illustrative embodiment, the method comprises forming a film stack comprised of at least one process layer and a layer of photoresist above a semiconducting substrate, illuminating the film stack, and measuring light reflected off the film stack to generate an optical characteristic trace for the film stack. The method further comprises comparing the generated optical characteristic trace to a target optical characteristic trace, and determining, based upon the comparison between the generated optical characteristic trace and the target optical characteristic trace, at least one parameter of an exposure process to be performed on the film stack. In a further embodiment, the method comprises modifying, based upon a deviation between the generated optical characteristic trace and the target optical characteristic trace, at least one parameter of an exposure process to be performed on the film stack. The film stack may be comprised of one or more process layers and the layer of photoresist.

In another illustrative embodiment, the method comprises forming a film stack comprised of at least one process layer and a layer of photoresist above a semiconducting substrate, illuminating the film stack, and measuring light reflected off the film stack to generate an optical characteristic trace for the film stack. The method further comprises correlating the generated optical characteristic trace to a calculated optical characteristic trace, the calculated optical characteristic trace having associated optical characteristics, and determining, based upon the comparison between the generated optical characteristic trace and the calculated optical characteristic trace, at least one parameter of an exposure process to be performed on the film stack. In a further embodiment, the method comprises modifying, based upon a deviation between the generated optical characteristic trace and the calculated optical characteristic trace, at least one parameter of an exposure process to be performed on the film stack. In a more specific embodiment, a library comprised of a plurality of calculated optical characteristic traces is provided, each of which correspond to a unique film stack combination.

BRIEF DESCRIPTION OF THE DRAWINGS

The invention may be understood by reference to the following description taken in conjunction with the accompanying drawings, in which like reference numerals identify like elements, and in which.

Figure 1:
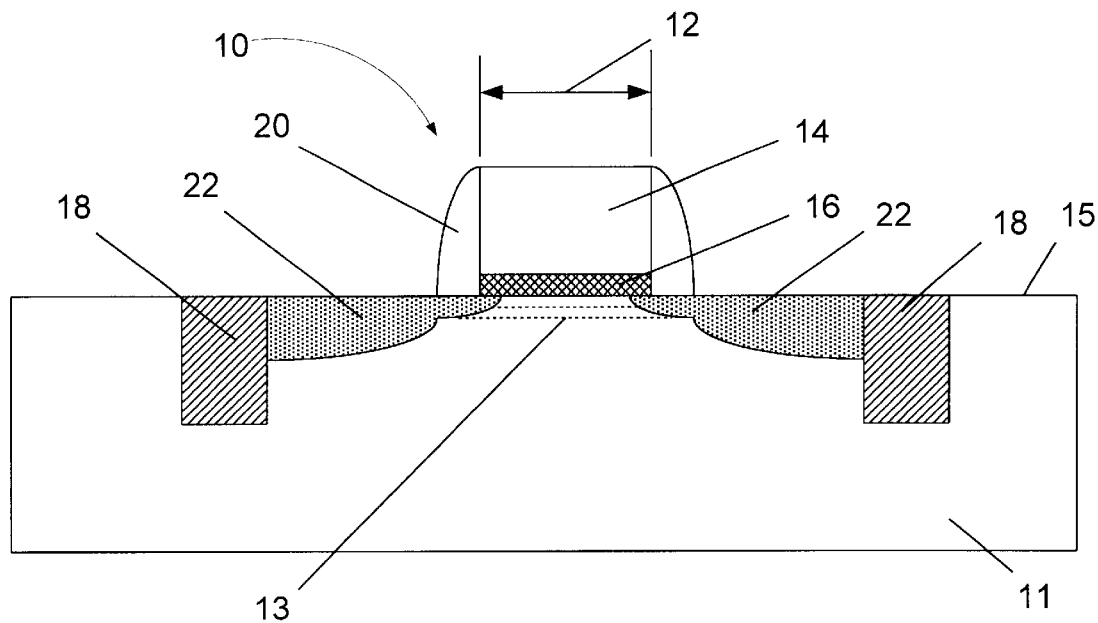
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of controlling exposure process parameters based upon optical properties of incoming process layers, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist.

More particularly, the photolithography process generally involves the steps of: (1) applying a layer of photoresist above a wafer, typically accomplished by a spin-coating process; (2) pre-baking (or soft-baking) the layer of photoresist at a temperature of approximately 90–120° C. to reduce the level of solvents in the layer of photoresist and to improve the adhesion characteristics of the photoresist, (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

Figure 2:
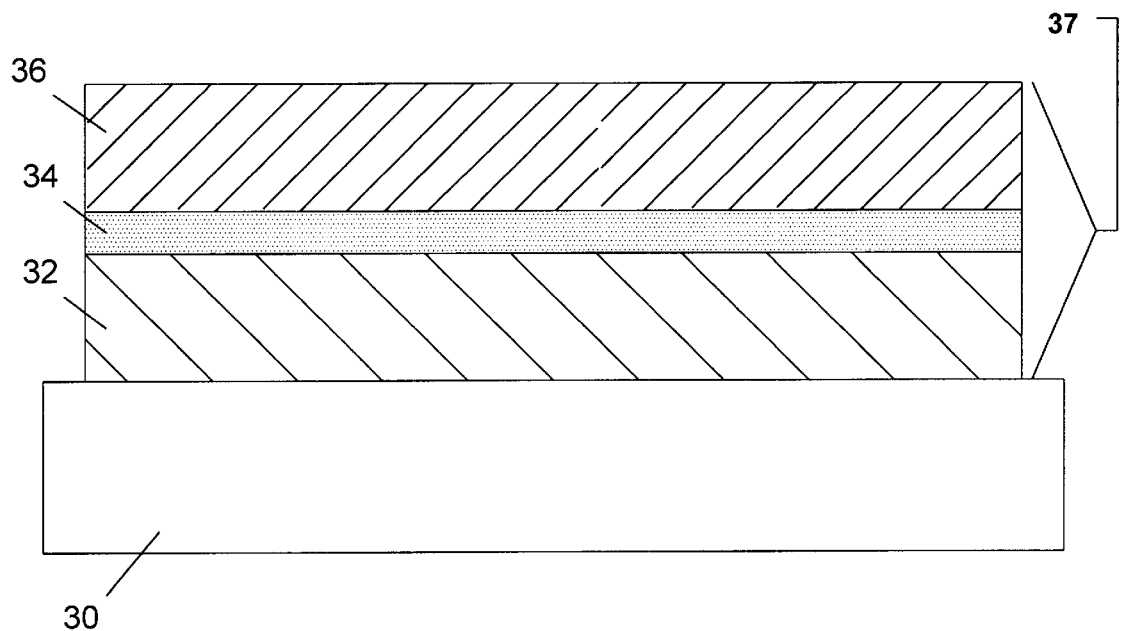
FIG. 2 is a cross-sectional view depicting an illustrative wafer having a plurality of process layers and a layer of photoresist formed thereabove.

As shown in FIG. 2, illustrative process layers 32, 34 are formed above a structure 30, and a layer of photoresist material 36 is formed above the process layer 34. As will be readily apparent to those skilled in the art after reading the present application, the structure 30 may be a semiconducting substrate, e.g., a silicon wafer, or it may represent one or more previously formed layers of material above such a semiconducting substrate, e.g., a stack of insulating layers each having a plurality of conductive interconnections formed therein.

The process layers 32, 34, as well as the layer of photoresist 36, are intended to depict an illustrative film stack 37 that will be subjected to an exposure process in a stepper tool (not shown in FIG. 2). After a complete reading of the present application, those skilled in the art will appreciate that the film stack 37 may be comprised of one or more process layers in addition to the layer of photoresist 36. For example, in the illustrated embodiment of the film stack 37 depicted in FIG. 2, the process layer 34 may be omitted. Thus, the present invention is adaptable to processing a wide variety of combinations of numbers of process layers and types of material.

Each of the illustrative process layers 32, 34 in the illustrative film stack 37 may be comprised of any type of material commonly encountered in semiconducting processing, e.g., polysilicon, metal, e.g., aluminum, an insulating material, e.g., silicon dioxide, HSQ, a layer of material having a dielectric constant greater than 3, etc. Moreover, the process layers 32, 34 may be formed by a variety of techniques used to form such materials, e.g., chemical vapor deposition (CVD), physical vapor deposition (PVD), thermal growth, etc., and the thickness of the process layers 32, 34 may vary greatly. Similarly, the layer of photoresist 36 may be either a positive or negative type photoresist, and it may be formed by a variety of techniques, e.g., a variety of spin-coating techniques commonly employed in modern semiconductor manufacturing. In one illustrative embodiment, the process layer 32 may be comprised of a layer of polysilicon having a thickness ranging from approximately 0.1–0.4 μm, and the process layer 34 may be comprised of an anti-reflective coating material (ARC) such as silicon nitride, silicon oxynitride, etc., that has a thickness ranging from approximately 0.03–0.06 μm. Both of the process layers 32, 34 may be formed by a CVD process. The layer of photoresist 36 may have a thickness ranging from approximately 0.5–0.8 μm.

Due to a variety of factors, the optical properties, e.g., reflectivity, index of refraction ("n"), and dielectric constant ("k") of the process layers comprising the film stack 37 may vary. As a result, the optical characteristics of the film stack 37 on which an exposure process will be performed will also vary. Such variations in the optical characteristics of the film stack 37 may lead to unacceptable variations in the resulting DICD dimensions in the patterned layer of photoresist that ultimately results from known photolithography processing. In turn, such variations in the DICD dimensions may result in removing the patterned layer of photoresist and starting the process over. All of these problems tend to reduce the overall efficiency of the manufacturing operations.

In general, the present invention is directed to a method of determining the optical characteristics of the film stack 37, and, based upon that information, controlling one or more parameters of an exposure process to be performed on the film stack 37, e.g., exposure dose, focus. That is, one or more of the optical characteristics of the film stack 37 is determined, and that information is fed forward to a controller that controls one or more parameters of an exposure process to be performed on the film stack 37.

Figure 3:
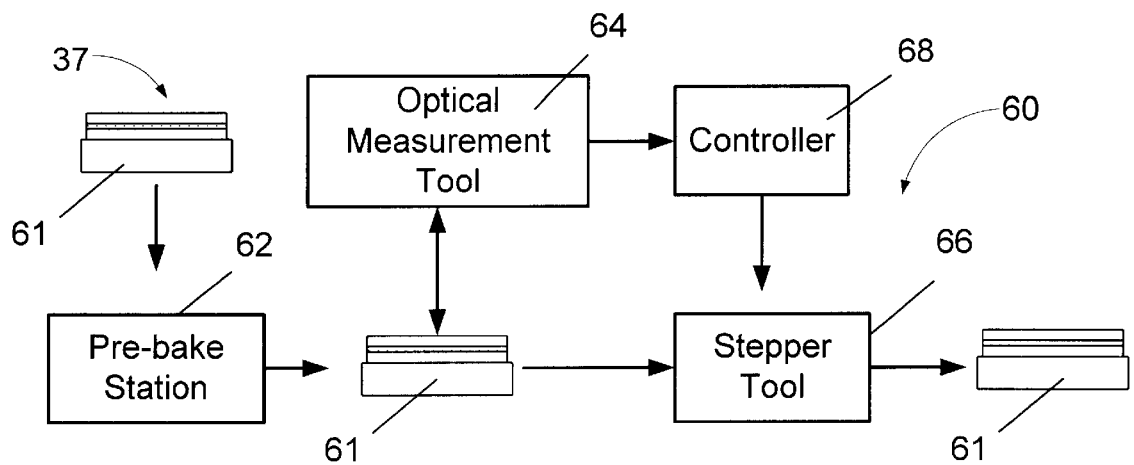
FIG. 3 depicts an illustrative embodiment of a system in accordance with one embodiment of the present invention.

An illustrative system 60 that may be used in one embodiment of the present invention is shown in FIG. 3. The system 60 is comprised of a pre-bake process station 62, an optical metrology tool 64, a stepper tool 66, and a controller 68. As indicated in FIG. 3, one or more wafers 61, having an illustrative film stack 37 comprised of at least one process layer and a layer of photoresist formed thereabove, are provided to the pre-bake process station 62 whereby they are subjected to a traditional pre-bake process. The pre-bake station 62 and stepper tool 66 are normally parts of a photolithography module formed in modern semiconductor manufacturing facilities. In one embodiment, the pre-bake station 62, the optical metrology tool 64 and the stepper tool 66 are all part of a photolithography module. In other embodiments, each of the various components of the system 60 may be separate processing stations. In yet other embodiments, the pre-bake station 62 and the stepper tool 66 are part of a photolithography module, and the optical metrology tool 64 is a stand-alone device or station.

Thereafter, using the optical metrology tool 64, one or more of the optical characteristics of the film stack 37 that is to be subjected to an exposure process in the stepper tool 66 is determined. That is, the optical metrology tool 64 may be used to generate an optical characteristic trace based upon values for reflectivity, the index of refraction ("n"), and/or the dielectric constant ("k") of one or more of the layers comprising the film stack 37, or of the composite film stack 37. This optical metrology data is provided to the controller 68. The optical data provided to the controller 68 may be averaged or otherwise statistically manipulated in the controller 68. The controller 68 then determines, based upon the optical data obtained by the optical metrology tool 64, one or more parameters of an exposure process to be performed on the wafer 61 in the stepper tool 66. That is, a parameter of the exposure process, e.g., exposure dose, focus, etc., may be determined or varied based upon the determined optical characteristics of the incoming film stack 37. For example, if data obtained from the optical metrology tool 64 indicates that the reflectivity of the incoming film stack is greater than a preselected target value, the exposure dose of the exposure process may be reduced as the increase in reflectivity will tend to lead to wider than anticipated features in the layer of photoresist 36. Conversely, if the reflectivity is less than a target value, the exposure dose may be increased. Similar techniques may be used with other optical parameters, e.g., index of refraction, dielectric constant, etc.

The optical metrology tool 64 may be any type of tool useful for measuring or determining the desired optical characteristics of the layers comprising the film stack 37 and/or the optical characteristics of the film stack 37 considered as a whole. For example, the optical metrology tool 64 may be a spectroscopic ellipsometer, a reflectometer or a scatterometer.

The number of and location of the optical measurements taken of the incoming film stack 37 may be varied as a matter of design choice. The more measurements taken, the higher degree of likelihood that the measurements actually reflect the true optical characteristics of the incoming film stack 37. However, the responsible process engineer may decide on an appropriate number of measurements to be taken, as well as the location of those measurements consistent with the degree of confidence desired by the process engineer with respect to the particular application under consideration.

The optical measurements of the film stack 37 may be performed on any desired number of wafers. For example, such measurements may be performed on all wafers in one or more lots, or on a representative number of wafers in a given lot, and these results may then be used to vary one or more parameters, e.g., the exposure dose, of the exposure process performed in the stepper tool 66 on the measured wafers or on subsequently processed wafers. Additionally, more than one lot of wafers may be analyzed until such time as the process engineer has achieved a sufficiently high degree of confidence that the metrology accurately reflects the optical characteristics of the film stack produced by a particular process flow.

As will be recognized by those skilled in the art, various optical characteristics of the film comprising a film stack, e.g., the illustrative process layers 32, 34, as well as the layer of photoresist 36, vary depending upon the wavelength of the light used during the exposure process. Most modern semiconductor manufacturing facilities tend to use either I-line or deep ultraviolet (DUV) exposure processes. I-line processes tend to use a mercury lamp as the light source and generate a light beam with a wavelength of approximately 365 nm. In deep ultraviolet systems, an excimer laser is generally used as the light source to generate an incident light of a wavelength of approximately 248 nm. It is anticipated that the wavelength of future exposure systems will employ light sources that generate light at a wavelength of 193 nm and 157 nm. As will be recognized by those skilled in the art upon a complete reading of the present application, the present invention may be used with existing technology, and it is readily adaptable to future improvements in exposure technology.

However, the optical metrology tools commonly employed today may only generate an incident light of approximately 300 nm. Since optical characteristics vary with wavelength and, at least with respect to deep ultraviolet systems, the exposure wavelength (approximately 248 nm) is less than that used in present-day optical measurement tools, an error may be induced. That is, the optical characteristics measured using light at a wavelength of approximately 300 nm is not the same as the optical characteristics at the intended exposure wavelength of approximately 248 nm. However, it is believed that any such error is relatively small and well within acceptable levels. Moreover, given the nature of semiconductor processing, other errors in manufacturing operations will tend to make the error introduced due to the mismatch between the wavelength of the optical measurement tool and the exposure wavelength relatively minor.

Figure 4A:
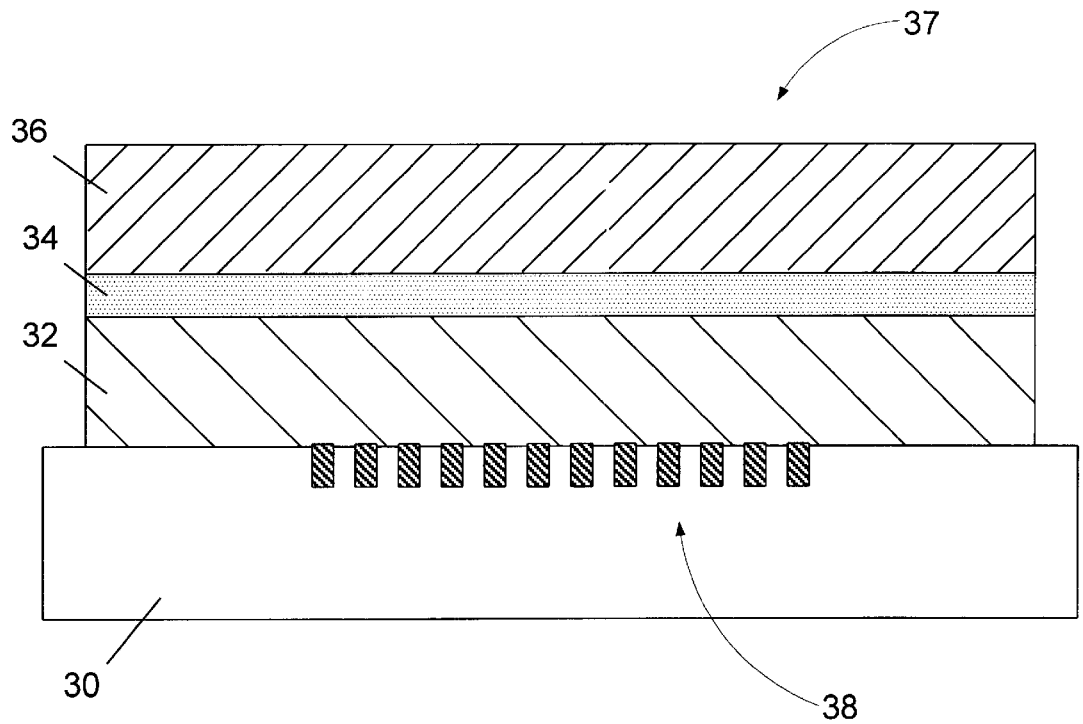
FIGS. 4A–C depict an illustrative grating structure formed in a semiconducting substrate.
Figure 4B:
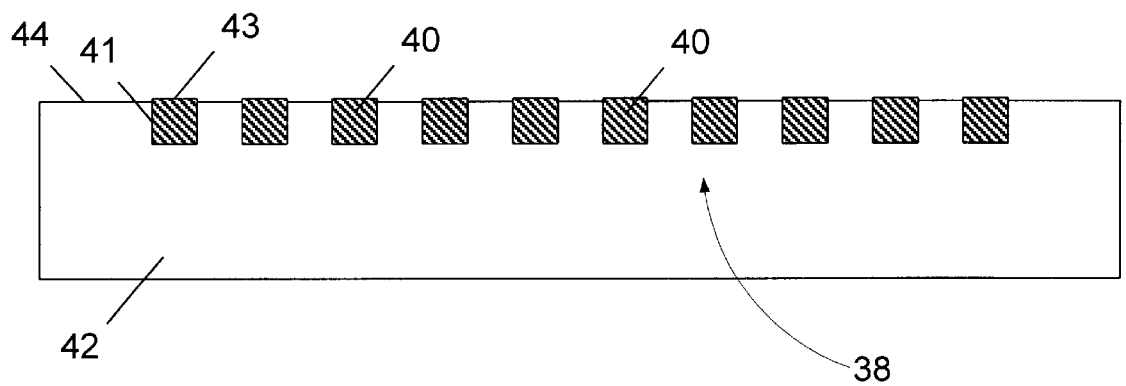
Figure 4C:
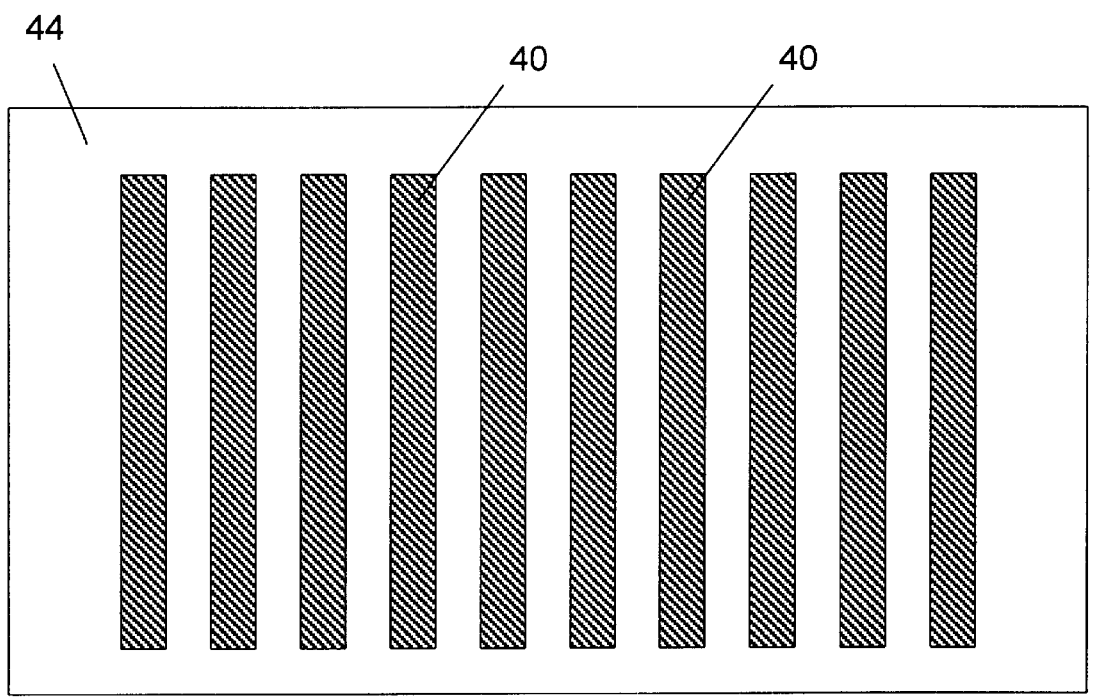

In another illustrative embodiment, a grating structure 38 may be used in the present invention. As shown in FIGS. 4A–C, a grating structure 38 may be formed in the structure 30 prior to forming a film stack 37, such as the illustrative process layers 32, 34, and the layer of photoresist 36, depicted in FIG. 4A. The grating structure 38 may be formed in a scribe line of semiconducting substrate, and it may take a variety of forms. In one illustrative embodiment, as shown in FIGS. 4B–C, the grating structure 38 is comprised of a plurality of trench isolation regions 40 formed in a semiconducting substrate 42. The trench isolation structure 40 may be formed by a variety of known techniques, e.g., by etching a plurality of trenches 41 in the substrate 42, and filling the trenches 41 with an appropriate insulating material, such as silicon dioxide. The isolation regions 40 may have an upper surface 43 that extends above a surface 44 of the substrate 42. The number of isolation regions 40 that may be formed on an actual device may vary. For example, the grating structure 38 may be formed in a 100 nm×120 nm region in which approximately 300–400 isolation regions 40 are formed (the length of which are parallel to the short side of the region).

As stated previously, scatterometric techniques may also be used to measure the optical characteristics of the film stack 37. A variety of optical metrology type tools may be used with the present invention, e.g., so-called 2θ-type systems and lens-type scatterometry tools. The optical metrology tool 64 may use white light, or some other wavelength or combination of wavelengths, depending on the specific implementation. Typically, the optical metrology tool 64 will generate an incident beam that has a wide spectral composition and wherein the intensity of the light changes slowly in comparison to changes in wavelength.

The angle of incidence of the light may also vary, depending on the specific implementation. The intensity of the reflected light may be measured as s- and p-polarization over either multiple angles or at multiple wavelengths.

In general, the optical metrology tool 64 includes optical hardware, such as an ellipsometer or reflectometer, and a data processing unit loaded with a scatterometry software application for processing data collected by the optical hardware. For example, the optical hardware may include a Model OP5230 or OP5240 with a spectroscopic ellipsometer offered by Thermawave, Inc. of Fremont, Calif. The data processing unit may comprise a profile application server manufactured by Timbre Technologies, a fully owned subsidiary of Tokyo Electron America, Inc. of Austin, Tex. and distributed by Thermawave, Inc.

Through use of the present invention, a signature or optical characteristic trace, associated with a particular film stack 37, may be established for a vast variety, if not all, possible combinations of film stacks readily anticipated by the design process. The optical characteristic traces may be calculated using Maxwell's equations. The optical characteristic trace may be based on a variety of characteristics or factors, including, but not limited to, the thickness, the index of refraction ("n"), the dielectric constant ("k"), and/or the reflectivity of one or more of the individual process layers and/or the layer of photoresist that make up the film stack 37. Moreover, the characteristics or factors may be for the entirety of the film stack 37, i.e., considering the film stack 37 as a whole.

Variations in one or more of the optical characteristics of the film stack 37, e.g., index of refraction, will cause a significant change in the diffraction characteristics of the incident light from the light source of the optical measurement tool 64. Thus, a unique optical characteristic trace may be calculated (using Maxwell's equations) for each unique combination of film stacks 37 anticipated by the design process. A library may be created that contains optical characteristic traces corresponding to each unique combination of anticipated film stacks. Scatterometry libraries are commercially available from Timbre Technologies, Inc. Obviously, the number of combinations used to create the library may vary as a matter of design choice. Moreover, the greater the number of combinations, the greater will be the library containing the appropriate signature profiles of the film stack characteristics.

For example, in one illustrative embodiment, as shown in FIG. 2, the process layer 32 may be comprised of polysilicon that has a thickness ranging from approximately 0.1–0.3 $\mu$m, the process layer 34 is comprised of silicon nitride having a thickness ranging from 0.04–0.06 $\mu$m, and the layer of photoresist 38 may have a thickness that ranges from approximately 0.3–0.6 $\mu$m. In order to account for manufacturing variability, it is assumed that the layer of polysilicon may be formed at eleven distinct thicknesses (0.10, 0.12, 0.14, 0.16, 0.18, 0.20, 0.22, 0.24, 0.26, 0.28 and 0.30 $\mu$m), i.e., a resolution value of 0.02 $\mu$m in thickness is assumed. Similar assumptions may be made with respect to the process layer 34 and the layer of photoresist. Assuming a 0.02 $\mu$m resolution value for the process layer 34, eleven thickness variations are also anticipated for the process layer 34. For the photoresist layer 36, a resolution value of 0.05 $\mu$m is anticipated resulting in seven anticipated thickness values (0.50, 0.55, 0.60, 0.65, 0.70, 0.75 and 0.80) for the layer of photoresist. Considering all combinations, 847 (11×11×7) unique film stack combinations may exist. If desired, a unique optical characteristic trace may be calculated for each unique combination, and a library may be established for each of the anticipated combinations.

Each of these calculated optical characteristic traces, or groups of such traces, may have associated stepper recipes or parameters associated therewith. For example, each of the optical characteristic traces, or groups of such traces, in the library may have an associated stepper recipe that includes parameters such as exposure dose, focus, etc. to be used on film stacks 37 having optical characteristics the same as, or similar to, the an optical characteristic trace. That is, a measured or generated optical characteristic trace for an incoming film stack 37 is compared to, or matched with, an optical characteristic trace from the library, and a stepper exposure process is performed on the film stack 37 using the stepper process parameters associated with the trace from the library.

As set forth above, FIG. 3 depicts an illustrative system 60 that may be employed with the present invention. The optical metrology tool 64 generates an optical characteristic trace of the incoming film stack 37 formed on an illustrative wafer 61 that has been processed through the pre-bake station 62. Thereafter, in one embodiment of the present invention, the generated optical characteristic trace is compared to a preselected target optical characteristic trace. The preselected optical characteristic trace corresponds to a desired characteristic of the film stack 37 such that resulting DICD dimensions in the patterned layer of photoresist are within an acceptable range. Based upon a comparison between the generated trace and the target trace, the controller 68 may determine one or more parameters of an exposure process to be performed on the film stack 37. In a further embodiment, the controller 68 may determine if there is a deviation between the generated (or measured) optical characteristic trace and the target optical characteristic trace. If so, the controller 68 may then change one or more parameters of the exposure process to be performed on the incoming film stack 37 to compensate for the variations in the optical characteristics of the incoming film stack 37. For example, one or more parameters of the exposure process, e.g., exposure dose, focus, etc., may be adjusted to achieve the desired DICD dimension in the resulting patterned layer of photoresist.

In another embodiment, the present invention may be employed to compare a measured or generated optical characteristic trace to a library of calculated optical characteristic traces, each of which corresponds to a particular anticipated film stack combination having a unique optical characteristic trace. That is, in this embodiment, the method comprises calculating additional optical characteristic traces for different combinations of film stacks, and establishing a library comprised of a plurality of the optical characteristic traces, wherein each of the plurality of traces is representative of the optical characteristics of a unique film stack combination.

In this embodiment, the optical metrology tool 64 is used to generate an optical characteristic trace for a given film stack 37 combination. The optical metrology tool 64 may sample one or more wafers in a lot, depending on the specific implementation. Moreover, the optical characteristic traces may be averaged or otherwise statistically analyzed. The controller 68 compares the optical characteristic trace (i.e., individual or averaged) generated by the optical metrology tool 64 to a library of calculated optical characteristic traces with known film stack combinations to correlate or match the generated optical characteristic trace to at least one of the optical characteristic traces in the library. Based upon these comparisons, the controller 68 may determine one or more parameters of an exposure process to be performed on the incoming film stack 37. In a further embodiment, the controller 68 may adjust one or more parameters of an exposure process to be performed on the incoming film stack 37 in the stepper tool 68. For example, each of the optical characteristic traces, or groups of such traces, in the library may have an associated stepper recipe that includes parameters such as exposure dose, focus, etc. to be used on film stacks 37 having optical characteristics the same as, or similar to, the correlated or matched optical characteristic trace from the library.

Control equations may be employed to adjust the operating recipe of the stepper tool 66 in situations where the methods described herein indicate that the incoming film stack 37 has less than desirable optical characteristics. The control equations may be developed empirically using commonly known linear or non-linear techniques. The controller 68 may automatically control the operating recipes of the stepper tool 66 used to perform an exposure process on the incoming film stack 37. Through use of the present invention, the extent and magnitude of variations in targeted DICD dimensions in a patterned layer of photoresist may be reduced.

In another illustrative embodiment, the present invention may also make use of an embedded grating structure 38. A variety of different combinations of film stack 37 may be formed above the grating structure 38. In a similar fashion to that described above, each unique film stack 37 formed above the grating structure 38 will result in a unique optical characteristic trace. In one embodiment, a wafer having a film stack 37 formed above a grating structure, like the grating structure 38, is provided to the optical metrology tool 64. An optical characteristic trace for the combination of the incoming film stack and the grating is generated, and this generated trace may be compared to a target optical characteristic trace. Based upon this comparison, the controller 68 may determine one or more parameters of an exposure process to be performed on the incoming film stack 37. In a further step, the controller 68 may modify, based upon a deviation in the generated trace and the target trace, one or more parameters of an exposure process to be performed on the incoming film stack 37.

In another embodiment, the generated optical characteristic trace of an incoming film stack 37 and grating structure 38 may be compared to one or more optical characteristic traces stored in a library. Each of the traces in the library correspond to a unique film stack 37 combination positioned above the grating structure 38. Based upon a comparison or matching of the generated trace and at least one of the traces stored in the library, the controller 68 may determine one or more parameters of an exposure process to be performed on the film stack 37. In a further step, one or more parameters of the exposure process may be varied based upon which of the traces in the library is or are matched or correlated to the generated trace.

In yet a further embodiment, after the formation of an illustrative grating structure, such as the grating structure 38 depicted in FIGS. 4A–C, a scatterometry tool may be used to generate an optical characteristic trace for that particular grating structure. Thereafter, a variety of film stacks 37 (see FIG. 4A) may be formed above the grating structure 38. After the film stack 37 is formed, another optical characteristic trace of the grating structure 38 may be generated. The optical characteristics of the particular film stack 37 combination formed above the grating structure 38 will cause a change in the optical characteristic trace of the grating structure 38 taken after the film stack 37 is formed. Thus, deviations in the generated optical characteristic traces of the grating structure 38 before and after the film stack 37 is formed may also be used to determine the optical characteristics of the film stack 37. As a result, one or more parameters of the exposure process to be performed in the stepper tool 66 may be varied to ultimately produce a patterned layer of photoresist having the desired DICD dimensions. As with the previous embodiment, the deviations in the measurement of the grating structure 38 before and after the formation of the film stack 37 may be compared to a target optical characteristic trace, or it may be compared to a library of calculated optical characteristic traces corresponding to different combinations of film stacks 37.

In the illustrated embodiments, the controller 68 is a computer programmed with software to implement the functions described herein. Moreover, the functions described for the controller 68 may be performed by one or more controllers spread through the system. For example, the controller 68 may be a fab level controller that is used to control processing operations throughout all or a portion of a semiconductor manufacturing facility. Alternatively, the controller 68 may be a lower level computer that controls only portions or cells of the manufacturing facility. Moreover, the controller 68 may be a stand-alone device, or it may reside on the stepper tool 66 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 68, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is generally directed to a method of controlling exposure process parameters based upon the optical properties of incoming process layers. In one illustrative embodiment, the method comprises forming a film stack comprised of at least one process layer and a layer of photoresist above a semiconducting substrate, illuminating the film stack, and measuring light reflected off the film stack to generate an optical characteristic trace for the film stack. The method further comprises comparing the generated optical characteristic trace to a target optical characteristic trace, and determining, based upon the comparison between the generated trace and the target trace, at least one parameter of an exposure process to be performed on the incoming film stack. A further step may involve modifying, based upon a deviation between the generated optical characteristic trace and the target optical characteristic trace, at least one parameter of an exposure process to be performed on the film stack.

In another illustrative embodiment, the method comprises forming a film stack comprised of at least one process layer and a layer of photoresist above a semiconducting substrate, illuminating the film stack, and measuring light reflected off the film stack to generate an optical characteristic trace for the film stack. The method further comprises correlating or matching the generated optical characteristic trace to a calculated optical characteristic trace, the calculated optical characteristic trace having associated optical characteristics, and determining, based upon the comparison between the generated trace and the calculated trace, at least one parameter of an exposure process to be performed on the incoming film stack. A further step may involve modifying, based upon a deviation between the generated optical characteristic trace and the calculated optical characteristic trace, at least one parameter of an exposure process to be performed on the film stack.

The present invention is also directed to a system that may be used to perform the methods described herein. In one embodiment, the system is comprised of an optical metrology tool, a controller and a stepper tool. The optical metrology tool is adapted to obtain an optical characteristic measurement of a film stack to be subjected to an exposure process in the stepper tool and generate an optical characteristic trace for the incoming film stack. The controller may determine or vary one or more parameters of an exposure process to be performed in the stepper tool based upon a deviation between the generated optical characteristic trace and either a target optical characteristic trace or a historical optical characteristic trace.

Through use of the present invention, better process control may be achieved in modem integrated circuit manufacturing facilities. Additionally, the present invention may enable more precise formation of various features of integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a grating structure;

forming a film stack comprised of at least one process layer and a layer of photoresist above said grating structure;

illuminating said grating structure and said film stack;

measuring light reflected off the film stack and said grating structure to generate an optical characteristic trace for said film stack and said grating structure;

comparing the generated optical characteristic trace to a target optical characteristic trace; and determining, based upon said comparison of said generated optical characteristic and said target optical characteristic trace, at least one parameter of an exposure process to be performed on said film stack.

2. The method of claim 1, further comprising modifying, based upon a deviation between the generated optical characteristic trace and the target optical characteristic trace, at least one parameter of an exposure process to be performed on said film stack.

3. The method of claim 1, further comprising correlating the generated optical characteristic trace to a calculated optical characteristic trace stored in a library, the calculated optical characteristic trace having an associated optical characteristic.

4. The method of claim 3, further comprising modifying, based upon a deviation between the generated optical characteristic trace and the calculated optical characteristic trace, at least one parameter of an exposure process to be performed on said film stack.

5. The method of claim 1, wherein measuring the reflected light comprises measuring the intensity of the reflected light.

6. The method of claim 1, further comprising providing a library comprised of a plurality of calculated optical characteristic traces, each of which correspond to a unique film stack combination positioned above said grating structure.

7. The method of claim 1, wherein measuring light reflected off the film stack to generate an optical characteristic trace for said film stack is performed after the layer of photoresist is subjected to a pre-bake process.

8. The method of claim 1, wherein modifying at least one parameter of an exposure process comprises modifying at least one of an exposure dose and a focus of said exposure process.

9. A method, comprising:

forming a grating structure;

forming a film stack comprised of at least one process layer and a layer of photoresist above said grating structure;

illuminating said grating structure and said film stack;

measuring light reflected off the film stack and said grating structure to generate an optical characteristic trace for said film stack and said grating structure;

comparing the generated optical characteristic trace to a target optical characteristic trace; and modifying, based upon a deviation between the generated optical characteristic trace and the target optical characteristic trace, at least one parameter of an exposure process to be performed on said film stack.

10. The method of claim 9, further comprising correlating the generated optical characteristic trace to a calculated optical characteristic trace stored in a library, the calculated optical characteristic trace having an associated optical characteristic.

11. The method of claim 10, further comprising modifying, based upon a deviation between the generated optical characteristic trace and the calculated optical characteristic trace, at least one parameter of an exposure process to be performed on said film stack.

12. The method of claim 9, wherein measuring the reflected light comprises measuring the intensity of the reflected light.

13. The method of claim 9, further comprising providing a library comprised of a plurality of calculated optical characteristic traces, each of which correspond to a unique film stack combination positioned above said grating structure.

14. The method of claim 9, wherein measuring light reflected off the film stack to generate an optical characteristic trace for said film stack is performed after the layer of photoresist is subjected to a pre-bake process.

15. The method of claim 9, wherein modifying at least one parameter of an exposure process comprises modifying at least one of an exposure dose and a focus of said exposure process.

16. A method, comprising:

forming a grating structure;

forming a film stack comprised of at least one process layer and a layer of photoresist above said grating structure;

illuminating said grating structure and said film stack;

measuring light reflected off the film stack and said grating structure to generate an optical characteristic trace for said film stack and said grating structure;

providing a library comprised of a plurality of calculated optical characteristic traces, each of which correspond to a unique film stack combination formed above said grating structure;

correlating the generated optical characteristic trace to a calculated optical characteristic trace, the calculated optical characteristic trace having associated optical characteristics; and determining, based upon said optical characteristics of said correlated optical characteristics trace, at least one parameter of an exposure process to be performed on said film stack.

17. The method of claim 16, further comprising modifying, based upon said optical characteristics of said correlated optical characteristic trace, at least one parameter of an exposure process to be performed on said film stack.

18. The method of claim 16, further comprising comparing the generated optical characteristic trace to a target optical characteristic trace.

19. The method of claim 18, further comprising modifying, based upon a deviation between the generated optical characteristic trace and the target optical characteristic trace, at least one parameter of an exposure process to be performed on said film stack.

20. The method of claim 16, wherein measuring the reflected light comprises measuring the intensity of the reflected light.

21. The method of claim 16, wherein measuring light reflected off the film stack to generate an optical characteristic trace for said film stack is performed after the layer of photoresist is subjected to a pre-bake process.

22. The method of claim 16, wherein modifying at least one parameter of an exposure process comprises modifying at least one of an expose dose and a focus of said exposure process.

23. A method, comprising:

forming a grating structure;

forming a film stack comprised of at least one process layer and a layer of photoresist above said grating structure;

illuminating said grating structure and said film stack;

measuring light reflected off the film stack and said grating structure to generate an optical characteristic trace for said film stack and said grating structure;

providing a library comprised of a plurality of calculated optical characteristic traces, each of which correspond to a unique film stack combination;

correlating the generated optical characteristic trace to a calculated optical characteristic trace, the calculated optical characteristic trace having associated optical characteristics; and modifying, based upon the optical characteristics of said correlated optical characteristic trace, at least one parameter of an exposure process to be performed on said film stack.

24. The method of claim 23, further comprising comparing the generated optical characteristic trace to a target optical characteristic trace.

25. The method of claim 24, further comprising modifying, based upon a deviation between the generated optical characteristic trace and the target optical characteristic trace, at least one parameter of an exposure process to be performed on said film stack.

26. The method of claim 23, wherein measuring the reflected light comprises measuring the intensity of the reflected light.

27. The method of claim 23, wherein measuring light reflected off the film stack to generate an optical characteristic trace for said film stack is performed after the layer of photoresist is subjected to a pre-bake process.

28. The method of claim 23, wherein modifying at least one parameter of an exposure process comprises modifying at least one of an expose dose and a focus of said exposure process.

* * * * *